United States Patent
Ueno et al.

(10) Patent No.: US 7,141,208 B2
(45) Date of Patent: Nov. 28, 2006

(54) FE-CO-B ALLOY TARGET AND ITS PRODUCTION METHOD, AND SOFT MAGNETIC FILM PRODUCED BY USING SUCH TARGET, AND MAGNETIC RECORDING MEDIUM AND TMR DEVICE

(75) Inventors: Hide Ueno, Yasugi (JP); Tomonori Ueno, Yasugi (JP); Shinichiro Yokoyama, Yasugi (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/833,308

(22) Filed: Apr. 28, 2004

(65) Prior Publication Data

US 2005/0011308 A1 Jan. 20, 2005

(30) Foreign Application Priority Data

Apr. 30, 2003 (JP) ............................. 2003-125914

(51) Int. Cl.
*B22F 3/15* (2006.01)
*H01F 1/14* (2006.01)

(52) U.S. Cl. ..................................................... 419/49

(58) Field of Classification Search ................... 419/49
See application file for complete search history.

(56) References Cited

U.S. PATENT DOCUMENTS

| | | | | |
|---|---|---|---|---|
| 6,608,738 B1 * | 8/2003 | Sakakima et al. | ..... | 360/324.11 |
| 6,753,072 B1 * | 6/2004 | Chen et al. | .................. | 428/828 |
| 6,759,005 B1 * | 7/2004 | Zhang | .......................... | 419/11 |
| 6,831,314 B1 * | 12/2004 | Higo et al. | .................. | 257/295 |
| 2002/0058159 A1 | 5/2002 | Kubota et al. | | |
| 2003/0128481 A1 * | 7/2003 | Seyama et al. | .......... | 360/324.1 |
| 2003/0228238 A1 * | 12/2003 | Zhang et al. | .................. | 419/30 |

FOREIGN PATENT DOCUMENTS

JP 2003-304010 10/2003

\* cited by examiner

*Primary Examiner*—Ngoclan T. Mai
(74) *Attorney, Agent, or Firm*—Sughrue Mion, PLLC

(57) ABSTRACT

An Fe—Co—B alloy target, in which the largest inscribed circle depictable in regions containing no boride phases in its cross-sectional microstructure has a diameter of 30 μm or less. Its composition is represented by $(Fe_xCo_{100-X})_{100-Y}B_Y$ (by atomic percentage), wherein $5 \leq X \leq 95$, and $5 \leq Y \leq 30$.

3 Claims, 3 Drawing Sheets

FE-CO-B ALLOY TARGET AND ITS PRODUCTION METHOD, AND SOFT MAGNETIC FILM PRODUCED BY USING SUCH TARGET, AND MAGNETIC RECORDING MEDIUM AND TMR DEVICE

FIELD OF THE INVENTION

The present invention relates to an Fe—Co—B alloy target for forming soft magnetic films and its production method, and a magnetic recording medium and a tunnel magnetoresistive device having a soft magnetic film formed by using such an Fe—Co—B alloy target.

BACKGROUND OF THE INVENTION

Recent drastic progress of magnetic recording technologies provides large-volume drives, resulting in higher recording densities of magnetic recording media. However, if a higher recording density were sought in magnetic recording media of an longitudinal magnetic recording system widely used at present, recording bits would have to be too small to record by a recording head, needing much higher coercivity. Accordingly, investigation has been conducted to provide a perpendicular magnetic recording system to increase a recording density.

The perpendicular magnetic recording system uses a magnetic film having an easy axis of magnetization orientated in a perpendicular direction to the recording surface, suffering from little decrease in read-write characteristics because of small demagnetization in bits in a high recording density, and thus suitable for a high recording density. A two-layer recording medium having a magnetic recording layer and a soft magnetic layer for an increased recording sensitivity has been developed for the perpendicular magnetic recording system. As the soft magnetic film of the two-layer recording medium, the use of a soft magnetic film of an Fe—Co—B alloy has been proposed (see US 2002/0058159A1).

Development has been actively conducted recently to provide magnetoresistive random access memories (MRAMs), etc. as devices comprising tunnel magnetoresistive (TMR) elements. The use of the soft magnetic Fe—Co—B alloy film for such TMR device has been proposed (see JP 2003-304010 A).

A magnetron sputtering method is generally used for the formation of soft magnetic films for the two-layer media and soft magnetic films for the TMR devices. The magnetron sputtering method is a method in which a magnetic flux is leaked from a magnet disposed on the back of the target to a target surface, and a plasma is focused in the leaked magnetic flux region, to achieve a high-speed film formation. Accordingly, if the target had high permeability, a sufficient leaked magnetic flux would not be formed on the target surface. Accordingly, the target should have as small permeability as possible.

OBJECTS OF THE INVENTION

Accordingly, an object of the present invention is to provide a low-permeability Fe—Co—B alloy target having sputtering characteristics suitable for soft magnetic films used for perpendicular magnetic recording media, TMR devices, etc.

Another object of the present invention is to provide a method for producing such an Fe—Co—B alloy target.

A further object of the present invention is to provide a soft magnetic film produced by using such an Fe—Co—B alloy target.

A still further object of the present invention is to provide a magnetic recording medium or a TMR device having such a soft magnetic film.

DISCLOSURE OF THE INVENTION

As a result of investigation on the metallographic structures of Fe—Co—B alloy targets for soft magnetic films, the inventors have found that the Fe—Co—B alloy target can be provided with low permeability by finely and uniformly dispersing boride phases existing as the second phase. The present invention has been completed based on this finding.

Thus, the Fe—Co—B alloy target of the present invention is characterized in that the largest inscribed circle depictable in regions containing no boride phases in its cross-sectional microstructure has a diameter of 30 μm or less.

The target preferably has a composition represented by the general formula of $(Fe_XCo_{100-X})_{100-Y}B_Y$ (by atomic percentage), wherein $5 \leq X \leq 95$, and $5 \leq Y \leq 30$. The target is preferably a sintered body of atomized powder containing B. The target is also preferably a sintered body of atomized Fe—Co—B alloy powder.

The method of the present invention for producing an Fe—Co—B alloy target having a composition represented by the general formula of $(Fe_XCo_{100-X})_{100-Y}B_Y$ (by atomic percentage), wherein $5 \leq X \leq 95$, and $5 \leq Y \leq 30$, is characterized in sintering atomized powder containing B.

The atomized Fe—Co—B alloy powder is preferably sintered. The sintering is preferably carried out by hot-isostatic pressing.

The soft magnetic film of the present invention is formed by using the above Fe—Co—B alloy target.

The magnetic recording medium of the present invention has at least one soft magnetic layer formed by using the above Fe—Co—B alloy target.

The TMR device of the present invention has at least one soft magnetic layer formed by using the above Fe—Co—B alloy target.

DETAILED DESCRIPTION OF THE PREFERRED EMBODIMENTS

The feature of the present invention is that boride phases are dispersed in the Fe—Co—B alloy target as uniformly as possible, to reduce the permeability of the target.

Figure 1:
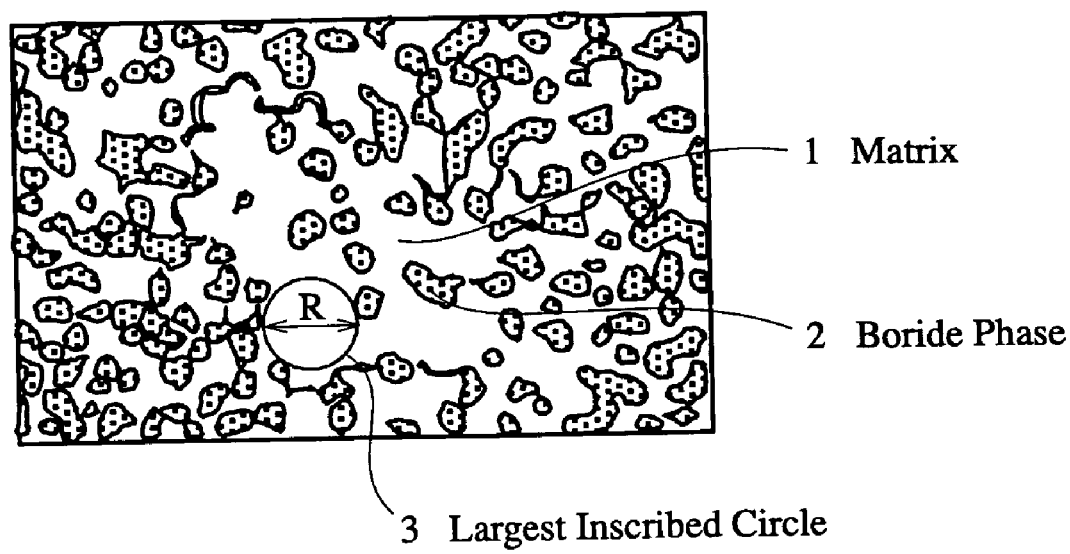
FIG. 1 is a schematic view showing a method for measuring the diameter of the largest inscribed circle depictable in regions having no boride phases in a cross-sectional microstructure of the target of the present invention.

B does not substantially dissolve in the matrix of the Fe—Co—B alloy, but is dispersed as boride phases (particles) in the matrix. The morphology and dispersion state of the boride phases largely depend on the production method of the target, accompanied by great variations in the magnetic properties of the target. FIG. 1 schematically shows the cross-sectional microstructure of the target. The microstructure comprises a matrix 1 and boride phases 2, and the largest inscribed circle 3 can be depicted in regions containing no boride phases 2 in the matrix 1. The diameter R of the largest inscribed circle 3 is a measure of how uniformly the boride phases 2 are dispersed in the matrix 1, indicating that the smaller the diameter R, the more uniformly the boride phases 2 are dispersed.

When fine boride phases are uniformly dispersed in the matrix, the resultant target has high coercivity and thus low permeability. Particularly when the largest inscribed circle depictable in regions containing no boride phases in its cross-sectional microstructure has a diameter of 30 µm or less, the Fe—Co—B alloy target has drastically decreased permeability. The diameter of the largest inscribed circle in regions having no boride phases in its cross-sectional microstructure is preferably 20 µm or less, more preferably 10 µm or less.

The boride phases and the matrix phase have extremely different sputtering rates, coarse boride phases causing the generation of irregular discharge and particles. Accordingly, it is effective to make the boride phases finer and more uniformly disperse them, to suppress the generation of irregular discharge and particles. Further, fine dispersion of the boride phases makes the target uniform in composition and thus the sputtered film more uniform in composition, resulting in stable film formation. For the above reasons, the average particle size of boride phases is preferably 5 µm or less.

Such fine structure can be obtained by pressure sintering of the Fe—Co—B mother alloy powder adjusted to have a predetermined composition. The Fe—Co—B mother alloy powder can be formed by a rapid cooling method, typically an atomizing method such as a gas-atomizing method, etc. Because the rapid solidifying of a melt makes it possible to suppress the formation of primary crystals containing no boride phases and the growth of coarser boride phases, powder having a structure in which fine boride phases are uniformly dispersed can be obtained.

The target having the structure of the present invention can be obtained by sintering the rapidly solidified powder. Particularly when the hot-isostatic pressing method is used, sintering can be advantageously conducted with the growth of boride phases extremely suppressed.

The target of the present invention can be obtained by using a mixed powder of rapidly solidified Fe—B alloy powder, Co—B alloy powder, Fe—Co—B alloy powder, etc. in a predetermined composition. To obtain the target with little unevenness in composition or structure, it is preferable to use powder obtained by rapidly solidified an Fe—Co—B mother alloy adjusted to have the predetermined composition.

The pressure sintering of Fe—Co—B is preferably carried out at 700° C.–1150° C. When it is lower than 700° C., the sintering does not proceed well. On the other hand, when it exceeds 1150° C., the resultant sintered body is likely to be melted. To obtain a dense sintered body, the pressure sintering is carried out preferably at a pressure of 50 MPa or more. Because the sintered body with voids may generate nodules on the target surface and particles and splash on the resultant film surface during sputtering, the sintered body should be as dense as possible. Specifically, the relative density (density of target/theoretical density×100) of the sintered body is preferably 97% or more, more preferably 99% or more.

The Fe—Co alloy has the largest saturation magnetic moment at the composition of Fe-35at % Co; more Fe or Co from this composition results in decrease in the magnetization of the Fe—Co alloy. JP 2003-304010 A describes that the magnetic resistance (MR) effect changes with an Fe/Co ratio.

B has a function to make the soft magnetic film amorphous and the crystals finer. When the amount of B added is small, such function cannot be obtained fully. And when it is too much, the magnetic properties of the soft magnetic film are deteriorated. Accordingly, in the Fe—Co—B alloy target of the present invention having a composition of $(Fe_XCo_{100-X})_{100-Y}B_Y$, $5 \leq X \leq 95$ and $5 \leq Y \leq 30$ are preferable.

Because the Fe—Co—B alloy for the perpendicular magnetic recording medium has the largest saturation magnetic moment at an atomic percentage of Fe to Co of 65:35, the composition represented by the general formula of $(Fe_XCo_{100-X})_{100-Y}B_Y$ is preferably $50 \leq X \leq 80$ and $7 \leq Y \leq 20$, more preferably $60 \leq X \leq 70$ and $9 \leq Y \leq 15$.

In the case of the Fe—Co—B alloy for the TMR device represented by the general formula of $(Fe_XCo_{100-X})_{100-Y}B_Y$, $7 \leq X \leq 35$ and $15 \leq Y \leq 25$ are preferable, and $9 \leq X \leq 30$, and $17 \leq Y \leq 23$ are more preferable, to control MR characteristics and coercivity.

As impurities contained in the target of the present invention, the amounts of gas components such as oxygen, etc. decreasing soft magnetic properties are preferably as small as possible. Specifically, O is preferably 300 ppm or less, more preferably 150 ppm or less on a mass basis. N is preferably 100 ppm or less, more preferably 50 ppm or less on a mass basis.

The present invention will be explained in detail referring to Examples below without intention of restricting the present invention thereto.

EXAMPLES 1–7,
COMPARATIVE EXAMPLES 1–6

Atomized alloy powders having compositions of $Fe_{bal}Co_{31.5}B_{10}$, $Fe_{bal}Co_{33.25}B_5$, $Fe_{bal}Co_{28}B_{20}$, $Fe_{bal}Co_{18}B_{10}$, $Fe_{bal}Co_{60}B_{20}$ and $Fe_{bal}Co_{72}B_{20}$, respectively, by atomic % were produced by a gas-atomizing method. Each atomized powder was charged into a soft steel capsule, evacuated and sealed, and hot-isostatic-pressed under the conditions of a pressure of 100 MPa, a temperature of 1000° C., and a holding time of 2 hours to produce a sintered body. The sintered bodies were machined to obtain targets of Examples 1–6 each having a diameter of 100 mm and a thickness of 5 mm.

Gas-atomized $Fe_{bal}B_{10}$ alloy powder and Gas-atomized $Co_{bal}B_{10}$ alloy powder were mixed to a composition of $Fe_{bal}Co_{31.5}B_{10}$. The resultant mixed powder was charged into a soft steel capsule, evacuated and sealed, and hot-isostatic-pressed under the conditions of a pressure of 100 MPa, a temperature of 1000° C., and a holding time of 2 hours to produce a sintered body. The sintered body was machined to obtain a target of Example 7 having a diameter of 100 mm and a thickness of 5 mm.

Ingots having compositions of $Fe_{bal}Co_{31.5}B_{10}$, $Fe_{bal}Co_{33.25}B_5$, $Fe_{bal}Co_{28}B_{20}$, $Fe_{bal}Co_{18}B_{10}$, $Fe_{bal}Co_{60}B_{20}$ and $Fe_{bal}Co_{72}B_{20}$, respectively, by atomic % were produced by a melt-casting method, and machined to obtain targets of Comparative Examples 1–6 each having a diameter of 100 mm and a thickness of 5 mm.

The following test piece was prepared from each target to measure its maximum permeability by a DC magnetic flux meter.

(1) Each alloy target of $Fe_{bal}Co_{31.5}B_{10}$, $Fe_{bal}Co_{33.25}B_5$, $Fe_{bal}Co_{28}B_{20}$ and $Fe_{bal}Co_{18}B_{10}$: A ring-shaped test piece having an outer diameter of 20 mm and an inner diameter of 16 mm was provided with an 80-turn primary coil and a 10-turn secondary coil to measure its maximum permeability in the maximum magnetic field of 4,000 A/m by a DC magnetic flux meter.

(2) Each alloy target of $Fe_{bal}Co_{60}B_{20}$ and $Fe_{bal}Co_{72}B_{20}$: A test piece having a length of 30 mm, a width of 10 mm and a thickness of 5 mm was measured by a DC magnetic flux meter in the maximum magnetic field of 160,000 A/m generated by an electromagnet.

A test piece of 10 mm×10 mm was taken out from each target, and its cross-sectional microstructure was observed by an optical microscope having a magnification of 400, to determine the diameter of the largest inscribed circle depictable in regions having no boride phases in the microstructure.

The average particle size of the boride phases was determined by a cutting method, in which a 50-mm-long arbitrary line was drawn in the photomicrograph (1000 times) of each cross-sectional microstructure of the target, and the line length occupied by the boride phases was divided by the number of the boride phases. Because boride phases had layer structures having extremely large aspect ratios in their eutectic portions in the targets of Comparative Examples 1–6 produced by the melt-casting method, the average particle size of the boride phases could not be measured.

The measurement results of the maximum permeability, the diameter of the largest inscribed circle, and the average particle size of the boride phases in each target are shown in Table 1.

TABLE 1

| No. | Composition (atomic %) | Production Method[1] | Maximum Permeability | R[2] (μm) | Ps[3] (μm) |
| --- | --- | --- | --- | --- | --- |
| Example 1 | $(Fe_{65}Co_{35})_{90}B_{10}$ | A | 400 | 6 | 3 |
| Example 2 | $(Fe_{65}Co_{35})_{95}B_5$ | A | 420 | 14 | 2 |
| Example 3 | $(Fe_{65}Co_{35})_{80}B_{20}$ | A | 370 | 8 | 5 |
| Example 4 | $(Fe_{80}Co_{20})_{90}B_{10}$ | A | 380 | 8 | 3 |
| Example 5 | $(Fe_{25}Co_{75})_{80}B_{20}$ | A | 30 | 14 | 5 |
| Example 6 | $(Fe_{10}Co_{90})_{80}B_{20}$ | A | 20 | 12 | 5 |
| Example 7 | $(Fe_{65}Co_{35})_{90}B_{10}$ | B | 350 | 8 | 4 |
| Comparative Example 1 | $(Fe_{65}Co_{35})_{90}B_{10}$ | C | 550 | 34 | — |
| Comparative Example 2 | $(Fe_{65}Co_{35})_{95}B_5$ | C | 620 | 38 | — |
| Comparative Example 3 | $(Fe_{65}Co_{35})_{80}B_{20}$ | C | 510 | 34 | — |
| Comparative Example 4 | $(Fe_{80}Co_{20})_{90}B_{10}$ | C | 530 | 36 | — |
| Comparative Example 5 | $(Fe_{25}Co_{75})_{80}B_{20}$ | C | 80 | 32 | — |
| Comparative Example 6 | $(Fe_{10}Co_{90})_{80}B_{20}$ | C | 50 | 32 | — |

Note
[1] A: The atomized powder of the Fe-Co-B alloy was sintered by a hot-isostatic pressing method.
B: A mixed powder of the atomized powder of the Fe-B alloy and the atomized powder of the Co-B alloy was sintered by hot-isostatic pressing.
C: Melt-casting method.
[2] The diameter of the largest inscribed circle.
[3] The average particle size of boride phases.

Figure 2:
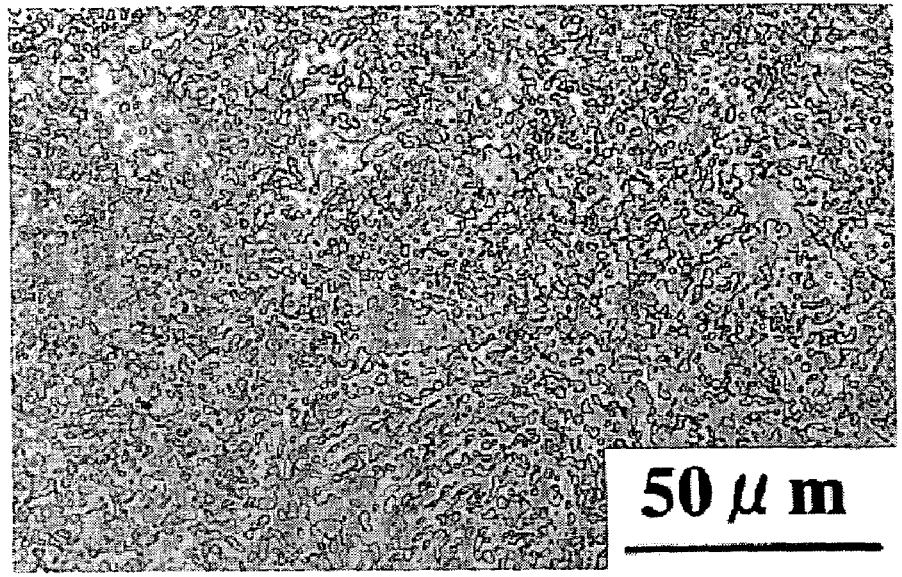
FIG. 2 is a photomicrograph showing the cross-sectional microstructure of the target of Example 1.
Figure 3:
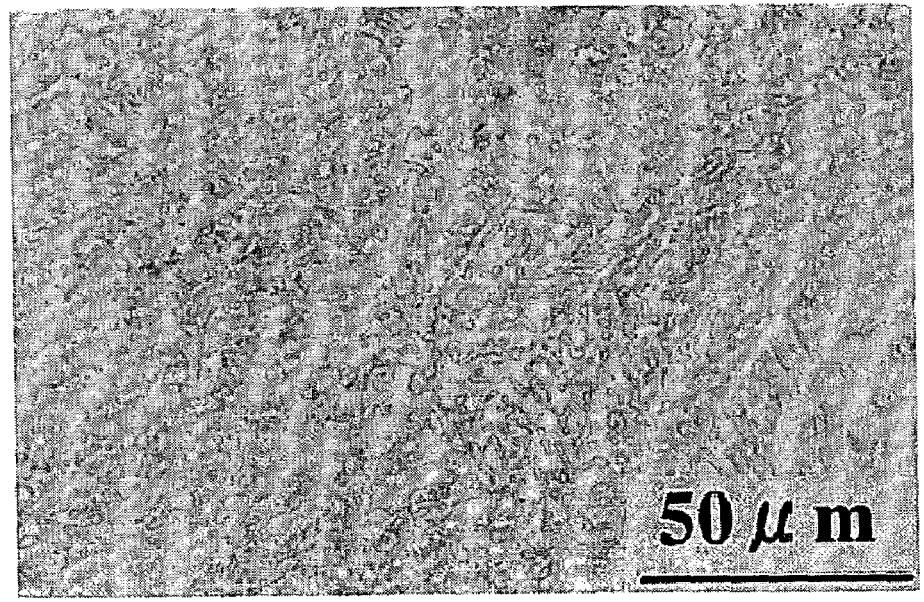
FIG. 3 is a photomicrograph showing the cross-sectional microstructure of the target of Example 5.
Figure 4:
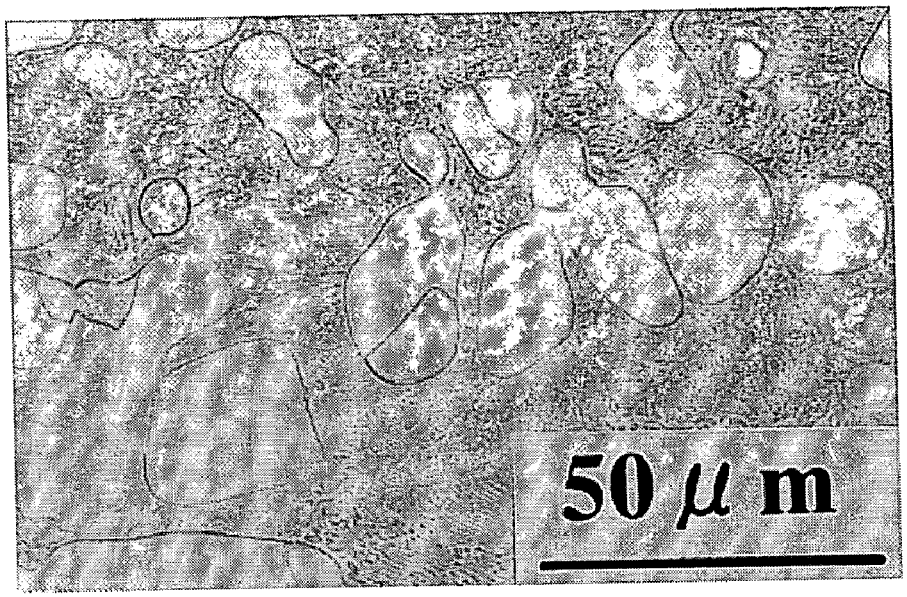
FIG. 4 is a photomicrograph showing the cross-sectional microstructure of the target of Comparative Example 1.
Figure 5:
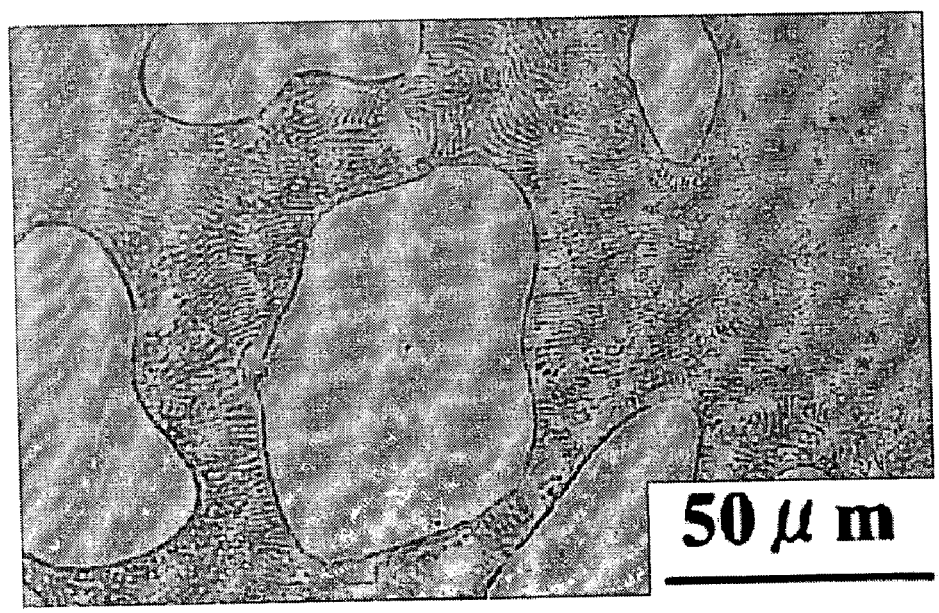
FIG. 5 is a photomicrograph showing the cross-sectional microstructure of the target of Comparative Example 1.

FIGS. 2 and 3 are respectively photomicrographs showing the cross-sectional microstructures of the Fe—Co—B alloy targets of Examples 1 and 5, typical examples of the present invention. Both of FIGS. 4 and 5 are respectively photomicrographs showing the cross-sectional microstructure of the target of Comparative Example 1.

It is clear from Table 1 and FIGS. 2–5 that when the diameter R of the largest inscribed circle depictable in regions having no boride phases is 30 μm or less, low-permeability Fe—Co—B alloy targets can be obtained. It is also clear from Table 1 and FIGS. 2 and 3 that the average particle size of boride phases is 5 μm or less in the Fe—Co—B alloy target of the present invention, indicating that it had a structure in which the boride phases are finely dispersed.

As described above, because the Fe—Co—B alloy target of the present invention has a structure having boride phases finely dispersed, it can form soft magnetic films stably by magnetron sputtering. Such soft magnetic films of the Fe—Co—B alloy are suitable for perpendicular magnetic recording media, and TMR devices such as MRAM, etc.

What is claimed is:

1. A method for producing an Fe—Co—B alloy target having a composition represented by the general formula of $(Fe_XCo_{100-X})_{100-Y}B_Y$ (by atomic percentage), wherein $5 \leq X \leq 95$ and $5 \leq Y \leq 30$, said method comprising sintering mixed powder of atomized powder of an Fe—B alloy and a Co—B alloy by hot-isostatic pressing to obtain said Fe—Co—B alloy target.

2. The method for producing an Fe—Co—B alloy target according to claim 1 wherein the Fe—Co—B alloy has a composition represented by the general formula $(Fe_XCo_{100-X})_{100-Y}B_Y$ (by atomic percentage), wherein $50 \leq X \leq 80$, and $7 \leq Y \leq 20$.

3. The method for producing an Fe—Co—B ally target according to claim 1 wherein the Fe—Co—B alloy has a composition represented by the general formula of $(Fe_XCo_{100-X})_{100-Y}B_Y$ (by atomic percentage), wherein $7 \leq X \leq 35$, and $15 \leq Y \leq 25$.

* * * * *